(12) United States Patent
Nakayama et al.

(10) Patent No.: US 7,599,206 B2
(45) Date of Patent: Oct. 6, 2009

(54) NON-VOLATILE SEMICONDUCTOR STORAGE DEVICE

(75) Inventors: Atsushi Nakayama, Yokohama (JP);
Toshimasa Namekawa, Ota-ku (JP);
Hiroaki Nakano, Yokohama (JP);
Hiroshi Ito, Yokohama (JP); Osamu Wada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 89 days.

(21) Appl. No.: 12/032,110

(22) Filed: Feb. 15, 2008

(65) Prior Publication Data
US 2009/0027973 A1 Jan. 29, 2009

(30) Foreign Application Priority Data
Feb. 15, 2007 (JP) ............................. 2007-034327

(51) Int. Cl.
*G11C 17/00* (2006.01)
*G11C 29/00* (2006.01)
*G11C 17/18* (2006.01)

(52) U.S. Cl. .................... 365/96; 365/201; 365/225.7
(58) Field of Classification Search .................. 365/96
See application file for complete search history.

(56) References Cited
U.S. PATENT DOCUMENTS
2006/0092742 A1* 5/2006 Paillet et al. ............. 365/225.7

2007/0103224 A1* 5/2007 Namekawa et al. ......... 327/536
2008/0080295 A1 4/2008 Namekawa et al.

FOREIGN PATENT DOCUMENTS
JP 2005-302091 10/2005

* cited by examiner

*Primary Examiner*—Son L Mai
(74) *Attorney, Agent, or Firm*—Turocy & Watson, LLP

(57) ABSTRACT

A non-volatile semiconductor storage device includes: one or more memory cells including anti-fuse elements capable of writing data by breaking down a gate insulation film of a MOS transistor with a high voltage; a sense node having its one end connected to each of the anti-fuse elements; a sense amplifier comparing the potential of the sense node with the reference potential and amplifying the difference therebetween, the sense amplifier being activated according to a sense-amplifier activation signal; an initialization circuit initializing the potential of the sense node according to an initialization signal; a control circuit outputting the initialization signal at a predetermined timing after input of an external signal input from the outside and outputting a first activation signal to activate the sense amplifier at a predetermined timing after input of the external signal; and a switching circuit outputting the first activation signal as the sense-amplifier activation signal when a normal data read operation is performed, and outputting an inverted version of the external signal as the sense-amplifier activation signal when a test execution is instructed for the one or more memory cells before the gate insulation film is broken down.

19 Claims, 10 Drawing Sheets

NON-VOLATILE SEMICONDUCTOR STORAGE DEVICE

CROSS-REFERENCE TO RELATED APPLICATIONS

This application is based upon and claims the benefit of priority from the prior Japanese Patent Application No. 2007-34327, filed on Feb. 15, 2007, the entire contents of which are incorporated herein by reference.

BACKGROUND OF THE INVENTION

1. Field of the Invention

The present invention relates to an electrically programmable non-volatile semiconductor storage device.

2. Description of the Related Art

Recently, an essential need exists for relatively small, heterogeneous-type non-volatile semiconductor storage devices in a semiconductor integrated circuit that may be consolidated on the same chip and that may continually retain the already-described information when the power turned off. Moreover, such demands have increased for redundancy application in mass storage memory such as DRAM or SRAM, for storage application for a code including an encryption key, for management application in manufacturing history, and so on.

Conventionally, a laser fuse has been used as a storage element for a non-volatile semiconductor storage device for these applications (see, for example, Japanese Patent Laid-Open No. (HEI) 9-36234 and 2001-168196). However, when a laser fuse is used, a problem arises that would increase cost for writing because a specially designed fuse blow device and the associated blow process are required accordingly. In addition, since the minimum dimension of a laser fuse is determined by the wavelength of the laser beam in use, it does not keep in step with refinement of other semiconductor devices, causing a problem that the percentage of area occupied by a laser fuse could gradually increase. Further, since a laser is used to perform write operation, a laser fuse needs to be exposed when writing. As a result, if data needs to be written after packaging, such a laser fuse may not be available. Therefore, recent years have raised hopes in electrically writable non-volatile elements.

As an example of such electrically writable non-volatile semiconductor storage elements, an anti-fuse element with a MOS structure is known in the art (see, for example, Japanese Patent Laid-Open No. 2001-168196 and 2003-115537). In a data write operation onto the element, data is written by applying a high-voltage to both ends of the element to break down an insulating film. On the other hand, in data read operation, such a low voltage is first applied to both ends of the anti-fuse element that would not break down the insulating film. Then, detection is made to determine whether the insulating film is broken down according to the amount of current, large or small, that flows into the anti-fuse, thereby reading one-bit information. As can be seen from the above, the anti-fuse element is one of the most promising non-volatile storage elements for future use, since it has such a simple data read/write operation that requires only voltage application to the both ends of the element.

The anti-fuse element provides a feature that no special manufacturing process is involved. This feature provides the benefits of reduced manufacturing cost. In addition, the anti-fuse element has the advantages of no performance degradation in other semiconductor devices that are consolidated on the same chip, including high-speed transistors for configuring logic gates and refined memory elements such as DRAM or SRAM.

However, as developments in semiconductor storage devices being directed to further refinement, some problems have recently been observed in utilizing these anti-fuse elements with MOS structures. There have been developed further refined semiconductor devices as well as thinner gate insulation films for providing further integrated and lower power-consumption semiconductor integrated circuits. Generally, a leakage current that flows into an insulation film exponentially increases as the device becomes thinner. Since the anti-fuse elements uses a state before breaking down the gate insulation film as a state of retaining 0 data, a problem arises that could lead to degradation of 0-data retaining characteristics as the leakage current increases in a corresponding gate insulation film.

It should be noted here that the amount of leakage current in the gate insulation film mentioned above is so small that poses no problem in normal usage such as for use in logic gates. Therefore, it is assumed that there will continue to be thinner gate insulation films and so will the leakage current increase accordingly. It is conceivable that a specialized process is applied in manufacturing insulation films of the anti-fuse element for mitigating the associated degradation of 0-data retaining characteristics in the anti-fuse elements. However, this could result in increased manufacturing cost and not applicable with the intended usage of anti-fuse elements. That is, the degradation of 0-data retaining characteristics associated with the thinner gate insulation films must be accepted in the anti-fuse elements.

Effective means for accepting such degradation of 0-data retaining characteristics associated with the thinner gate insulation films include detecting storage cells with poor 0-data retaining characteristics and replacing those with redundant cells. Thus, there is a need for a 0-margin test that detects such a storage cell with poor 0-data retaining characteristics. As described above, since the degradation of 0-data retaining characteristics results from the leakage current in the gate insulation films, it is assumed that the current value is to be significantly small. Therefore, the 0-margin test requires highly sensitive current detection capabilities to detect minute currents. Further, as the leakage current in the gate insulation film is sensitive to, e.g., variations in the film thickness of each gate oxide film, it is greatly affected by external factors. Accordingly, a wide range of current detection capabilities is required for the 0-margin test. That is, it is an important issue to enable current thresholds of the 0-margin test to be set in a "broad and highly accurate" fashion during 0-margin test operation.

For example, if an average of the leakage current in the gate insulation film of the anti-fuse element is as small as less than 1 nA, then, depending on individual differences, such an anti-fuse element with more than 50 nA appears at about several ppm. Under these circumstances, it is desirable that a current threshold to be used in a storage cell with poor 0-data retaining characteristics, i.e., the one used in 0-margin test, is set to not less than 50 nA. If the fraction defective is on the order of several ppm, then such defects may be repaired by a relatively small redundant circuit. Further, the leakage current in the gate insulation film of the anti-fuse element is so sensitive to variations in the film thickness of each gate oxide film that it could increase by a factor of 5 when the corresponding thinned gate is processed to be about only 10% thinner. In this case, the current threshold used in 0-margin test may be set to greater than 50 nA to suppress the rise in fraction defective. Conversely, if the thinned gate is processed to be about 10% thinner, the current threshold used in 0-margin test may be set to less than 50 nA, which may, as described below, enable the margin for 1-data retaining characteristics to be set larger.

Meanwhile, the upper limit of the current threshold used in 0-margin test is restricted by the characteristics of read current in anti-fuse elements that retain 1 data, as will be discussed further below.

The read current of anti-fuse elements in which the gate insulation film was broken down, i.e., the read current of those retaining 1 data, is expected to be on the order of 100 μA. However, since there would actually be large individual differences, those anti-fuse elements may often appear with respective read currents less than 10 μA.

Under these circumstances, in order to ensure the read current of anti-fuse elements that retain 1 data, such a verify-rewrite technique is proposed that detects anti-fuse elements with insufficient read currents by comparing with a current threshold of a predefined 1-margin test, e.g., 10 μA, and executes additional program (see, for example, Japanese Patent Laid-Open No. 2005-302091). With this technique, the amount of read current for anti-fuse elements that retain 1 data may be set, e.g., to not less than 10 μA. However, the effects of this technique are also limited. If the current threshold of 1-margin test is set to more than the capability of itself, those storage cells may appear with respective read currents not exceeding the current threshold of 1-margin test no matter how many times rewrite operations are performed. The appearance of such storage cells is taken as a write operation failure, which could lead to a reliability problem.

In addition, it must be taken into account in setting current thresholds in normal read operation that the read current in those storage cells retaining 1 data have variations in its characteristics due to voltage dependency, environmental temperature dependency, time degradation, or the like. Therefore, as described above, if the current threshold of 1-margin test is set to on the order of 10 μA, then the upper limit of the current threshold for normal read operation is on the order of 1 μA.

The current threshold of 1-margin test and the current threshold for normal read operation are such setting parameters that should be determined by the characteristics of read current for Corresponding anti-fuse elements after programming. It is not so important to ensure accuracy in the current thresholds of 1-margin test and normal read operation, but rather, it is necessary to keep a constant ratio between these two current thresholds. It is also necessary to implement no complicated timing control in using non-volatile semiconductor storage devices. Therefore, it is desirable that the current thresholds of the current threshold of 1-margin test and normal read operation are set by circuit constants of the circuits that configure a corresponding non-volatile semiconductor storage device.

On the other hand, the current threshold used in 0-margin test may be set in a very wide range from the bottom of a distribution of leakage currents in the gate insulation film of the anti-fuse element, e.g., 50 nA, to the current threshold in normal read operation, e.g., less than 1 μA. Moreover, the leakage current in the gate insulation film of the anti-fuse element is greatly affected by the thickness of each gate insulation film. Further, the acceptable ratio of defect differs greatly depending on the usage of non-volatile semiconductor storage devices and its associated storage capacity, as well as means and magnitude of redundant circuits for use in repair of defective devices. To accommodate these circumstances, setting means is required that enables current thresholds for 0-margin test to be set in a highly flexible manner.

In order to set the current thresholds used in 0-margin test, it is also necessary to obtain distribution data for leakage currents in the gate insulation film of the anti-fuse element. Indeed, a significant amount of accurately measured data may be obtained from measurement of leakage current of anti-fuse elements implemented on a non-volatile semiconductor storage device. Although the 0-margin test features are efficient to achieve such measurements, it is necessary to provide a much wider range of current thresholds for 0-margin test and highly-sensitive current detection capabilities, e.g., up to 10 pA. Further, there is a need for means for setting current thresholds for 0-margin test at a narrow interval.

SUMMARY OF THE INVENTION

A non-volatile semiconductor storage device according to one aspect of the present invention comprises: one or more memory cells including anti-fuse elements capable of writing data by breaking down a gate insulation film of a MOS transistor with a high voltage; a sense node having its one end connected to each of the anti-fuse elements; a sense amplifier comparing a potential of the sense node with a reference potential and amplifying the difference therebetween, the sense amplifier being activated according to a sense-amplifier activation signal; an initialization circuit initializing the potential of the sense node according to an initialization signal; a control circuit outputting the initialization signal at a predetermined timing after input of an external signal input from the outside and outputting a first activation signal to activate the sense amplifier at a predetermined timing after input of the external signal; and a switching circuit outputting the first activation signal as the sense-amplifier activation signal when a normal data read operation is performed, and outputting an inverted version of the external signal as the sense-amplifier activation signal when a test execution is instructed for the one or more memory cells before the gate insulation film is broken down.

DETAILED DESCRIPTION OF THE EMBODIMENTS

Embodiments of a non-volatile semiconductor storage device according to the present invention will now be described below with reference to the accompanying drawings.

First Embodiment

Configuration of the First Embodiment

Figure 1:
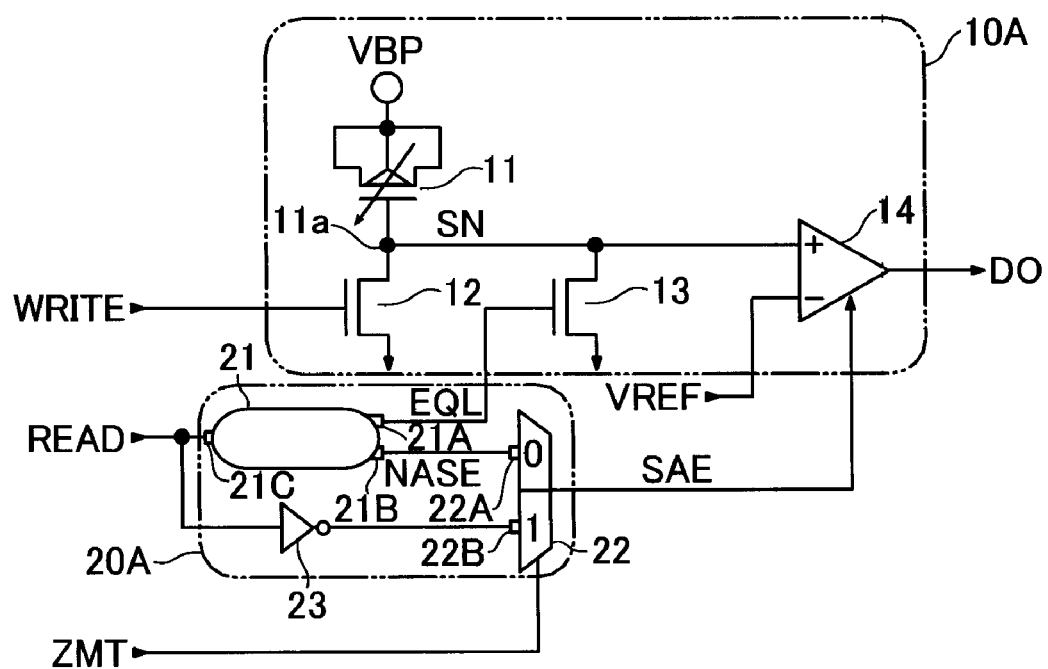
FIG. 1 is a schematic diagram of a non-volatile semiconductor storage device according to a first embodiment of the present invention.

A configuration of a non-volatile semiconductor storage device according to a first embodiment of the present invention will now be described below with reference to FIG. 1. FIG. 1 is a schematic diagram of the non-volatile semiconductor storage device according to the first embodiment of the present invention. As illustrated in FIG. 1, the non-volatile semiconductor storage device according to the first embodiment mainly comprises a first storage unit 10A that stores data, and a first operation control unit 20A that controls modes of operation for the first storage unit 10A.

The storage unit 10A has an anti-fuse element 11, a write transistor 12, a sense-node initialization circuit 13, and a differential-amplifier-type sense amplifier 14.

The anti-fuse element 11 includes a p-type MOS transistor with its source, drain, and bulk terminals connected in common to a programming power supply VBP. The gate terminal of the anti-fuse element 11 is connected, as a sense node 11a, to the drain terminal of the write transistor 12, the drain terminal of the sense-node initialization circuit 13, and a non-inverting input terminal (+) of the sense amplifier 14. Data is written to the anti-fuse 11 by breaking down a gate insulation film of the anti-fuse element 11 with a high voltage. That is, the anti-fuse 11 has a function as a memory cell.

The other terminal (source terminal) of the write transistor 12 is connected to the ground potential. A write-operation instruction signal WRITE is input to the gate terminal of the write transistor 12. The write-operation instruction signal WRITE is used to write states to the anti-fuse element 11.

The other terminal (source terminal) of the sense-node initialization circuit 13 is connected to the ground potential. A sense-node-initialization control signal EQL is input to the gate terminal of the sense-node initialization circuit 13. The sense-node-initialization control signal EQL is used to discharge (initialize) a potential (a sense node signal SN) that has been charged to the sense node 11a. The sense-node initialization circuit 13 receives the sense-node-initialization signal EQL at the gate terminal to initialize the sense node 11a.

The sense amplifier 14 is a differential amplifier. The sense amplifier 14 begins its operation in response to a sense-amplifier-activation signal SAE. A sense node signal SN is input to the non-inverting input terminal (+) of the sense amplifier 14. A reference potential VREF is input to the inverting input terminal (−) of the sense amplifier 14. The sense amplifier 14 compares the sense node signal SN with the reference potential VREF and amplifies the difference therebetween to output an output signal DO from its output terminal.

The first operation control unit 20A has a charging-time control circuit 21, a switch 22, and an inverter 23.

The charging-time control circuit 21 controls the charging time to charge the sense node 11a. The charging-time control circuit 21 has a delay circuit within itself. A first output terminal 21A of the charging-time control circuit 21 is connected to the gate of the sense-node initialization circuit 13 to output the sense-node-initialization control signal EQL mentioned above. In addition, a second output terminal 21B of the charging-time control circuit 21 is connected to a first input terminal 22A of the switch 22 to output a sense-amplifier-activation signal for read operation NASE. Further, a read signal READ is input to an input terminal 21C of the charging-time control circuit 21.

Besides, the read signal READ is input from the outside and used to start reading data from the anti-fuse element 11. In addition, the read signal READ is used to start and stop a 0-margin test. The sense-amplifier-activation signal for read operation NASE is used to delay the read signal READ and output at a predetermined timing after its input.

The switch 22 is switched according to the operating condition of the storage unit 10A. The first input terminal 22A of the switch 22 is connected to the second output terminal 21B of the charging-time control circuit 21. In addition, the read signal READ is inverted via the inverter 23 and input to a second input terminal 22B of the switch 22. Also input to the switch 22 is a 0-margin-test instruction signal ZMT.

When the 0-margin-test instruction signal ZMT is in an inactive state, the switch 22 outputs a sense-amplifier-activation signal for read operation NASE as a sense-amplifier control signal SAE. On the other hand, when the 0-margin-test instruction signal ZMT is in an active state, the switch 22 outputs an inverted version of the read signal READ as a sense-amplifier control signal SAE, instead of the sense-amplifier-activation signal for read operation NASE.

Data Write Operation of the First Embodiment

A data write operation of the first embodiment will now be described below.

The write operation is performed by applying a high voltage to both ends of the anti-fuse element 11 to break down a gate insulation film that configures a MOS structure.

In this write operation, the programming power supply VBP is first applied to one end of the write transistor 12. Then, each of the write-operation instruction signal WRITE and the read signal READ is retained in an inactive state, i.e., the ground potential, respectively. Retaining this state, a boost operation is performed on the programming power supply VBP. With this operation, a potential (a sense node signal SN) of the sense node 11a increases as the programming power supply VBP is boosted, since each of the write transistor 12 and the sense-node initialization circuit 13 is in an off state. Therefore, the difference in potential between the both ends of the anti-fuse element 11 may be kept relatively small in this state, so that the gate insulation film of the anti-fuse element 11 may not be broken down. However, such potentials are determined by the balance between leakage current associated with the gate insulation film of the anti-fuse element 11 and off-leakage current of transistors that configure the write transistor 12 and the sense-node initialization circuit 13. Therefore, it is necessary to control the boosting rate of the programming power supply VBP not to be too steep.

In this write operation, as described above, upon the boost operation performed on the programming power supply VBP, the programming power supply VBP is boosted to a sufficiently high potential, e.g., 6V, for breaking down the gate insulation film. Then, while the programming power supply VBP is retained at a high potential (e.g., 6V), the write-operation instruction signal WRITE is brought into an active state, i.e., the power supply potential, e.g., 1.2V, only if 1 data is to be written. This operation causes the write transistor 12 to be conductive and its one end, the sense node 11a, to be brought into the ground potential. Therefore, such a high-voltage stress is applied to the both ends of the anti-fuse element 11 that corresponds to the difference in potential between the programming power supply VBP and the ground potential. After remaining in this state for a while, the gate insulation film of the anti-fuse element 11 is broken down and a relatively large current begins to flow from the programming power supply VBP through the broken down insulation film to the ground potential. Continuing to maintain the boosted state of the write power supply VBP and the inductive state of the write transistor 12, the relatively large current continuously flows into the gate insulation film of the anti-fuse element 11, thereby causing a structural transformation in the gate insulation film.

Finally, after the write-operation instruction signal WRITE is returned to an inactive state, the boost operation on the write power supply VBP is stopped and the write operation terminates. The gate insulation film that is broken down in this procedure is brought into a relatively low resistance state with thousands to tens of thousands ohms and does not restore its original good insulation characteristics.

Data Read Operation of the First Embodiment

Figure 2:
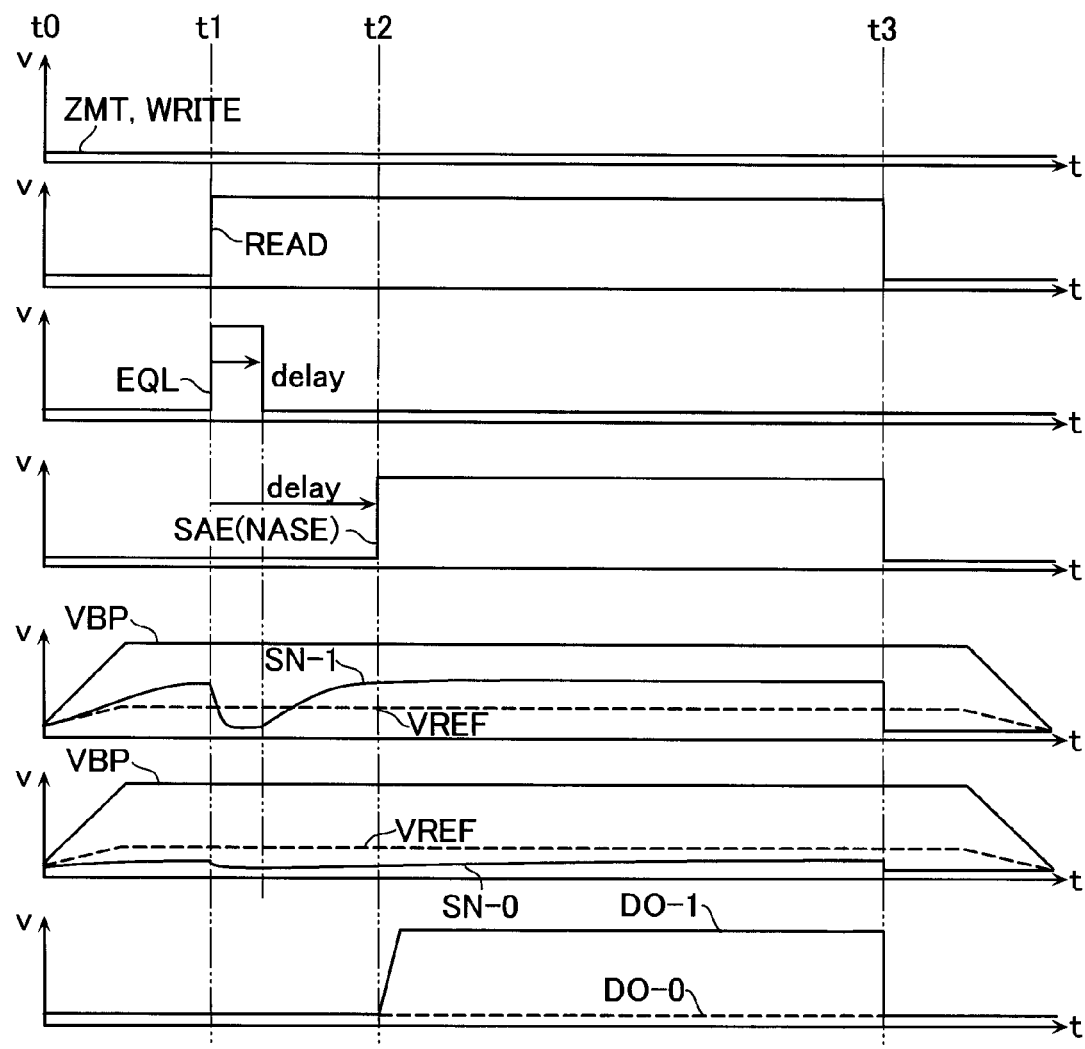
FIG. 2 is a diagram illustrating waveforms during a read operation of the non-volatile semiconductor storage device according to the first embodiment of the present invention.

A read operation of the first embodiment will now be described below with reference to FIG. 2. FIG. 2 is an operational waveform diagram for illustrating the read operation of the first embodiment. Throughout the read operation, the write-operation instruction signal WRITE and the 0-margin-test signal ZMT are kept in inactive states, i.e., at 0V. Since the 0-margin-test signal ZMT is kept at 0V, the switch 22 outputs a sense-amplifier-activation signal for read operation NASE as a sense-amplifier control signal SAE.

In this read operation, the write power supply VBP and the reference potential VREF are first turned on. Wherein, the potential of the write power supply VBP in the read operation needs to be arranged in such a way that the anti-fuse element 11 may not be broken down and the information that is accumulated in the anti-fuse element 11 may be read as an electrical signal in an accurate manner. For example, when a recent semiconductor device is used, an appropriate potential of the write power supply VBP is on the order of 1.2V. In addition, the reference potential VREF is provided to the inverting input terminal (−) of the sense amplifier 14 to determine whether the accumulated information in the anti-fuse element 11 is 0 or 1, comparing with the electrical signal read from the anti-fuse element 11. It is desirable that the reference potential VREF has as low a voltage as possible, so that as large a bias voltage as possible may be set that is applied to the anti-fuse element 11 in the read operation. At the same time, the reference potential VREF needs to be set to a high potential such that noise caused in association with the read operation may not affect the potential. Therefore, an appropriate reference potential for VREF is on the order of 0.3V, which is on the order of four times smaller than 1.2V of the power supply voltage.

Then, after the potential of the write power supply VBP and the reference potential VREF become stable, the read signal READ is activated. In response to the read signal READ, the delay circuit within the charging-time control circuit 21 generates a sense-node-initialization signal EQL and a sense-amplifier-activation signal for read operation NASE (a sense-amplifier-activation signal SAE) in sequence. In response to these two control signals, data that is stored in the anti-fuse element 11 is read as the following procedures:

A sense node initialization period is the period between when the sense-node-initialization signal EQL is activated immediately after the previous activation of the read signal READ and when it returns to its inactive state again. The sense node initialization period is defined by the delay circuit within the charging-time control circuit 21.

In response to the sense-node-initialization signal EQL, the sense-node initialization circuit 13 begins its operation and the potential (the sense node signal SN) of the sense node 11a is initialized to the ground potential. In FIG. 2, a sense node signal SN-1 indicates the behavior of the potential in the sense node 11a when the gate insulation film of the anti-fuse element 11 is broken down, i.e., when 1 data is stored in the anti-fuse element 11. On the other hand, a sense node signal SN-0 indicates the behavior of the potential in the sense node 11a when the gate insulation film of the anti-fuse element 11 is not broken down, i.e., when 0 data is stored in the anti-fuse element 11.

A sense-node charging time is the period between when the sense-node-initialization signal EQL returns to its inactive state again and when the sense-amplifier-activation signal SAE is activated. The sense-node charging time is also defined by the delay circuit within the charging-time control circuit 21. In other words, the sense-node charging time is defined by the sense-amplifier-activation signal for read operation NASE. During this sense-node charging period, the sense node 11a, which is previously initialized to the ground potential, is charged by a read current that flows through the anti-fuse element 11, and the potential of the sense node 11a increases accordingly. The increasing rate of potential depends on the magnitude of the read current that flows through the anti-fuse element 11.

If the gate insulation film of the anti-fuse element 11 is broken down, i.e., if 1 data is stored in the anti-fuse element 11, then a larger amount of current flows through the anti-fuse element 11. Consequently, as illustrated in FIG. 2, a rapid increase in potential of the sense node signal SN-1 is observed. On the other hand, if the gate insulation film of the anti-fuse element 11 is not broken down, i.e., if 0 data is stored in the anti-fuse element 11, then a smaller amount of current flows through the anti-fuse element 11. Consequently, as illustrated in FIG. 2, a gradual increase in potential of the sense node signal SN-0 (the potential of the sense node 11a) is observed.

Thereafter, at time t2 when the sense-amplifier-activation signal SAE transitions to an active state, the sense amplifier 14 begins its operation. At this moment, the sense amplifier 14 detects the difference in potential between the potential of the sense node 11a connected to the non-inverting input terminal (+) and the reference potential VREF connected to the inverting input terminal (−), the result of which is output as an output signal DO.

If 1 data is stored in the anti-fuse element 11, an output signal DO-1 becomes 1.2V, as illustrated in FIG. 2. On the other hand, if 0 data is stored in the anti-fuse element 11, an output signal DO-0 becomes the ground potential 0V, as illustrated in FIG. 2.

Thereafter, during the sense-amplifier-activation signal SAE is in an active state, the state of the output signal of the sense amplifier 14 remains unchanged. The output signal of the sense amplifier 14 still remains its previous condition, the ground potential 0V, even if the insulating condition of the gate insulation film is not good, and accordingly, the potential SN-0 of the sense node 11a illustrated in FIG. 2 increases to be higher than the reference potential VREF at a point in time between time t2 and time t3.

Then, the read signal READ returns to its inactive state and the read operation terminates. After the termination of the read operation, at time t3, the operation of the sense amplifier 14 is stopped and the output signals DO (DO-0 and DO-1) become the ground potential 0V.

Wherein, the sense-node-initialization signal EQL and the sense-amplifier-activation signal SAE are internal timing signals generated by the delay circuit within the charging-time control circuit 21. Therefore, the read operation has a feature that it is not susceptible to external influences including the pulse width of the read signal READ.

Zero-Margin Test Operation of the First Embodiment

Figure 3:
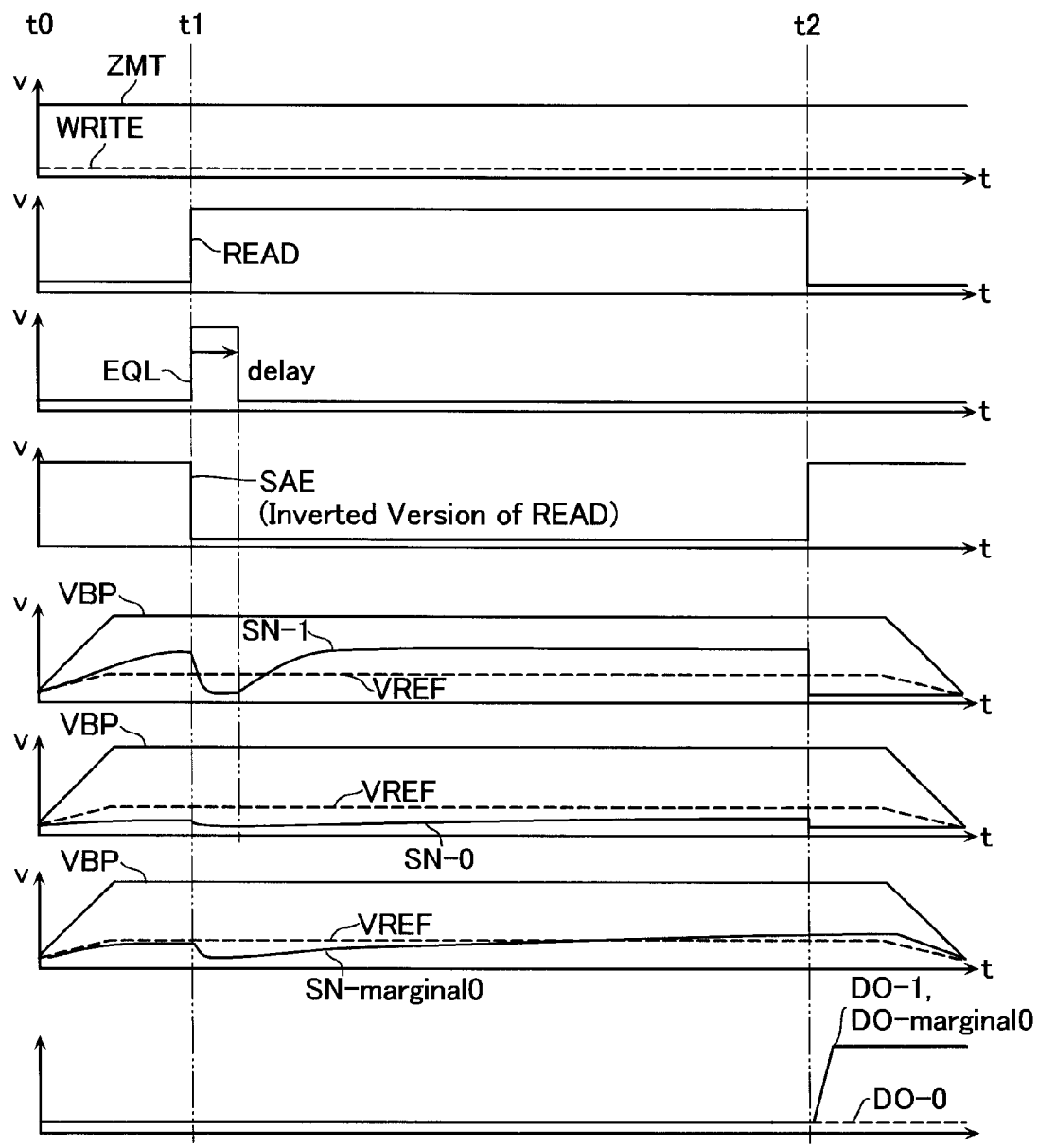
FIG. 3 is a diagram illustrating waveforms during a 0-margin test operation of the non-volatile semiconductor storage device according to the first embodiment of the present invention.

A 0-margin test operation of the first embodiment will now be described below with reference to FIG. 3. FIG. 3 is an operational waveform diagram for illustrating the 0-margin test operation of the first embodiment. Throughout this read operation, the write-operation instruction signal WRITE is kept in an inactive state, i.e. at the ground potential 0V, while the 0-margin-test signal ZMT is kept in an active state, i.e., at the power supply potential, e.g., 1.2V.

Firstly, prior to beginning the 0-margin test operation, the write power supply VBP and the reference potential VREF are first turned on at time t0. Wherein, each potential of the write power supply VBP and the reference potential VREF in the 0-margin test operation needs to be arranged in such a way that the anti-fuse element 11 may not be broken down and the information that is accumulated in the anti-fuse element 11 may be read as an electrical signal in an accurate manner. For example, when a recent semiconductor device is used, an appropriate potential is on the order of 1.2V. In addition, the reference potential VREF is provided to the inverting input terminal (−) of the sense amplifier 14 to determine whether the accumulated information in the anti-fuse element 11 is 0 or 1, comparing with the electrical signal read from the anti-fuse element 11. It is desirable that the reference potential VREF has as low as possible, so that as large a bias voltage as possible may be set that is applied to the anti-fuse element 11 in the read operation. At the same time, the reference potential VREF needs to be set to a high potential such that noise caused in association with the read operation may not affect the potential. Therefore, an appropriate reference potential for VREF is on the order of 0.3V, which is on the order of four times smaller than 1.2V of the power supply voltage.

Then, after the potential of the write power supply VBP and the reference potential VREF become stable, the read signal READ is activated at time t1. In response to the read signal READ, the charging-time control circuit 21 generates a sense-node-initialization signal EQL by the delay circuit within itself. On the other hand, the sense-amplifier-activation signal SAE in the 0-margin test operation is generated by the switch 22 using a different scheme than that of the read operation. The sense-amplifier-activation signal SAE is an inverted version of the read signal READ. In response to these two control signals, a 0-margin test is performed for testing insulation characteristics of the anti-fuse element 11 as the following procedures:

A sense node initialization period is the period between when the sense-node-initialization signal EQL is activated immediately after the previous activation of the read signal READ and when the sense-node-initialization signal EQL returns to its inactive state again. The sense node initialization period is defined by the delay circuit within the charging-time control circuit 21. In response to the sense-node-initialization signal EQL, the sense-node initialization circuit 13 begins its operation and the potential (the sense node signal SN) of the sense node 11a is initialized to the ground potential. In FIG. 3, a sense node signal SN-1 indicates the behavior of the potential in the sense node 11a when the gate insulation film of the anti-fuse element 11 is broken down, i.e., when 1 data is stored in the anti-fuse element 11. On the other hand, a sense node signal SN-0 indicates the behavior of the potential in the sense node 11a when the gate insulation film of the anti-fuse element 11 is not broken down, i.e., when 0 data is stored in the anti-fuse element 11. Further, a sense node signal SN-marginal0 indicates the behavior of the potential in the sense node 11a when the gate insulation film of the anti-fuse element 11 has poor insulation characteristics despite 0 data stored therein.

A sense-node charging time is the period between when the sense-node-initialization signal EQL returns to its inactive state again and time t2 when the sense-amplifier-activation signal SAE is activated. However, unlike the normal read operation, the sense-node charging time here is defined by the pulse width of the read signal READ that is provided from the outside. In other words, the sense-node charging time is defined by the inverted version of the read signal READ that is inverted at the inverter 23. During this sense-node charging period, the sense node SN, which is previously initialized to the ground potential, is charged by a read current that flows through the anti-fuse element 11 and the potential of the sense node SN increases accordingly. The increasing rate of potential depends on the magnitude of the read current that flows through the anti-fuse element 11. If the gate insulation film of the anti-fuse element 11 is not broken down, i.e., if 0 data is stored in the anti-fuse element 11, then a smaller amount of current flows through the anti-fuse element 11. Consequently, as indicated by the sense node signal SN-0, the potential of the sense node 11a is substantially retained at the ground potential 0V. Further, if the gate insulation film has poor characteristics despite 0 data is expected to be stored therein, then the potential of the sense node 11a increases at a very slow rate as indicated by the sense node signal SN-marginal0.

Thereafter, at time t2 when the sense-amplifier-activation signal SAE transitions to an active state, the sense amplifier 14 begins its operation. At this moment, the sense amplifier 14 detects the difference in potential between the potential (a sense node signal SN) of the sense node 11a connected to the non-inverting input terminal (+) and the reference potential VREF connected to the inverting input terminal (−), the result of which is output as an output signal DO. If 0 data is stored in the anti-fuse element 11, an output signal DO-0 becomes the ground potential 0V, as illustrated in FIG. 3. Further, as illustrated in FIG. 3, if the anti-fuse element 11 has poor insulation characteristics despite 0 data stored therein, an output signal DO-marginal0 becomes the power supply potential, e.g., 1.2V. Thereafter, during the sense-amplifier-activation signal SAE is in an active state, the state of the output signal of the sense amplifier 14 remains unchanged.

Advantage(s) of the First Embodiment

The first embodiment provides the following advantages:

Firstly in the read operation, a current threshold for read operation is mainly set by the sense-node charging time that is used to determine whether the stored data in the anti-fuse element 11 is 0 or 1. Wherein, the sense-node charging time is an internal parameter that is set by a circuit constant in the non-volatile semiconductor storage device. Therefore, although it is difficult to set the absolute value of the current threshold for read operation accurately, that absolute value remains constant regardless of the timing of external input signals. That is, the current threshold for read operation may be constant regardless of the usage of the non-volatile semiconductor storage device.

On the other hand, although a current threshold for 0-margin test is, as with the read operation, mainly set by the sense-node charging time, the sense-node charging time is controlled by an external input signal, i.e., the read signal READ. Therefore, the current threshold for 0-margin test is a measurement parameter that can be easily changed from the outside. This enables free and accurate setting of values for the current threshold for 0-margin test. For example, if the current detection is performed with a minute leakage, e.g., several nA leakage, it is required to set such a long sense-node charging time that can last over several ms. A delay circuit that generates such a long delay time that can last over several ms has a large layout size, which could lead to increased costs for its implementation. In addition, the resulting delay time offers a low degree of precision since it is susceptible to noise caused by the operating environment temperature, power supply voltage, external circuits, or the like. Therefore, the method for controlling the sense-node charging time using external input signals is more effective than others using internal delay circuits.

This 0-margin test allows for accurate extraction of anti-fuse elements with poor insulation characteristics. The extracted anti-fuse elements with poor insulation characteristics may be repaired by means for replacing those with redundant cells, thereby accepting the degradation of 0-data retaining characteristics associated with the thinner gate insulation films. Thus, an inexpensive and highly reliable non-volatile semiconductor storage device may be provided.

Second Embodiment

Configuration of the Second Embodiment

Figure 4:
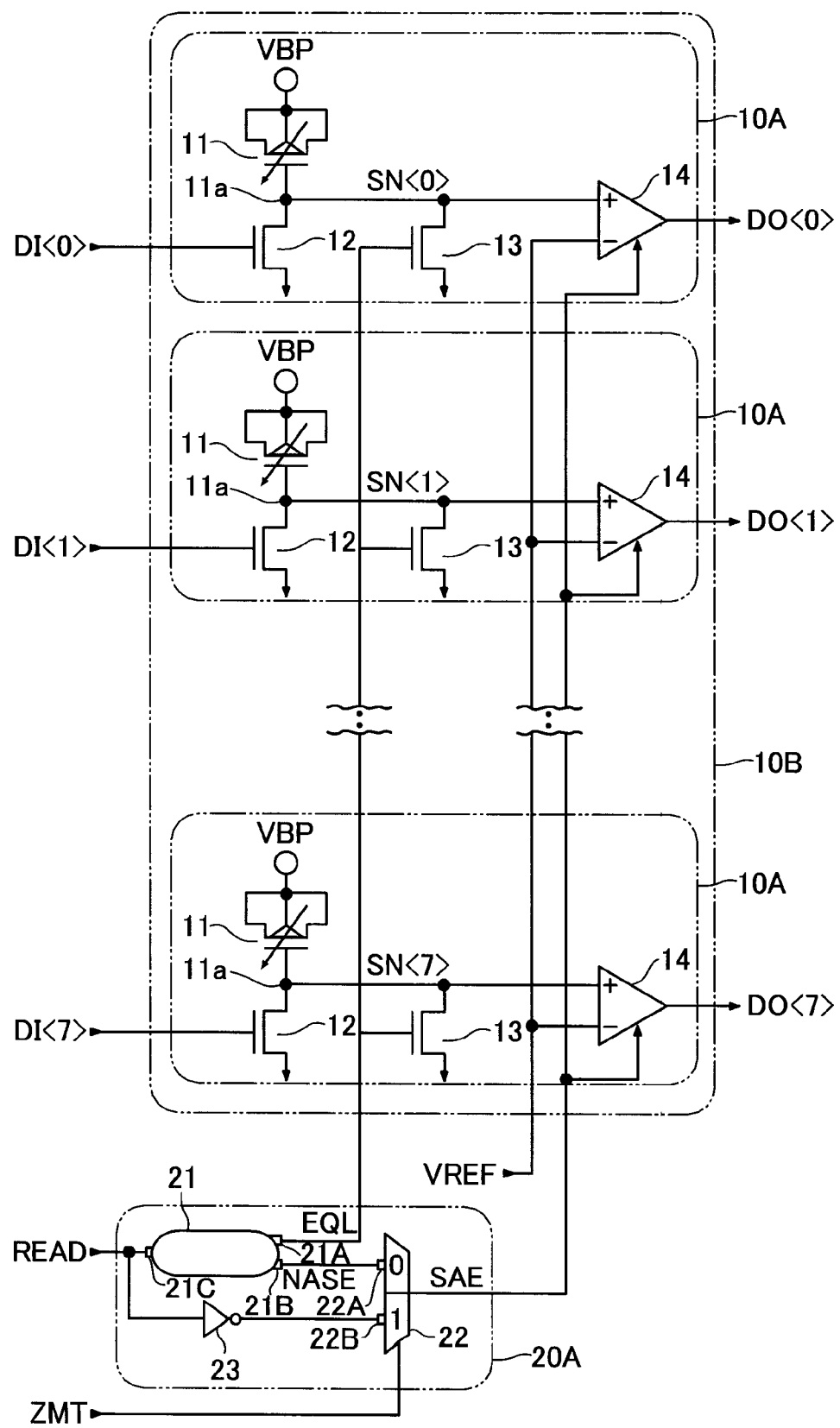
FIG. 4 is a schematic diagram of a non-volatile semiconductor storage device according to a second embodiment of the present invention.

A configuration of a non-volatile semiconductor storage device according to a second embodiment of the present invention will now be described below with reference to FIG. 4. Besides, the same reference numerals represent the same components as the first embodiment and description thereof will be omitted.

The non-volatile semiconductor storage device according to the second embodiment includes a second storage unit 10B and the first operation control unit 20A.

The second storage unit 10B has eight first storage units 10A of the first embodiment provided in parallel. That is, the non-volatile semiconductor storage device of the second embodiment has an 8-bit storage unit (memory cell).

Meanwhile, the first operation control unit 20A, which is the same as that of the first embodiment, is shared by the eight first storage units 10A. That is, the sense-node-initialization control signal EQL output from the charging-time control circuit 21 is input to a gate of a sense-node initialization circuit 13 in each of the first storage units 10A. In addition, the sense-amplifier-activation signal SAE output from the switch 22 is input to a sense amplifier 14 in each of the first storage units 10A.

As the above-mentioned configuration, unlike the first embodiment, a write instruction is made for each one bit and each sense node becomes an independent contact point for each one bit in the second embodiment. That is, each input signal DI<0> to DI<7> is input to a respective write transistor 12 in each of the first 8-bit storage units 10A. In addition, the sense amplifier 14 in each of the first 8-bit storage units 10A outputs a respective output signal DI<0> to DI<7>. In addition, a sense node 11a in each of the first 8-bit storage units 10A has a respective sense node signal SN<0> to SN<7>. Besides, the write, read and 0-margin test operations of the second embodiment are the same as those of the first embodiment and description thereof will be omitted.

Advantage(s) of the Second Embodiment

Advantages of the second embodiment will now be described below. The second embodiment may provide similar advantages to those described in the first embodiment. That is, the 0-margin test allows for accurate extraction of anti-fuse elements with poor insulation characteristics. In addition, the extracted anti-fuse elements with poor insulation characteristics may be repaired by means for replacing those with redundant cells, thereby accepting the degradation of 0-data retaining characteristics associated with the thinner gate insulation films. Thus, an inexpensive and highly reliable non-volatile semiconductor storage device may be provided. Besides, one major component, the first operation control unit 20A (including the charging-time control circuit 21, the switch 22, and the inverter 23) may be shared by a plurality of storage means in the non-volatile semiconductor storage device (first storage units 10A), thereby suppressing the increase in area and power consumption due to the implementation.

Third Embodiment

Configuration of the Third Embodiment

Figure 5:
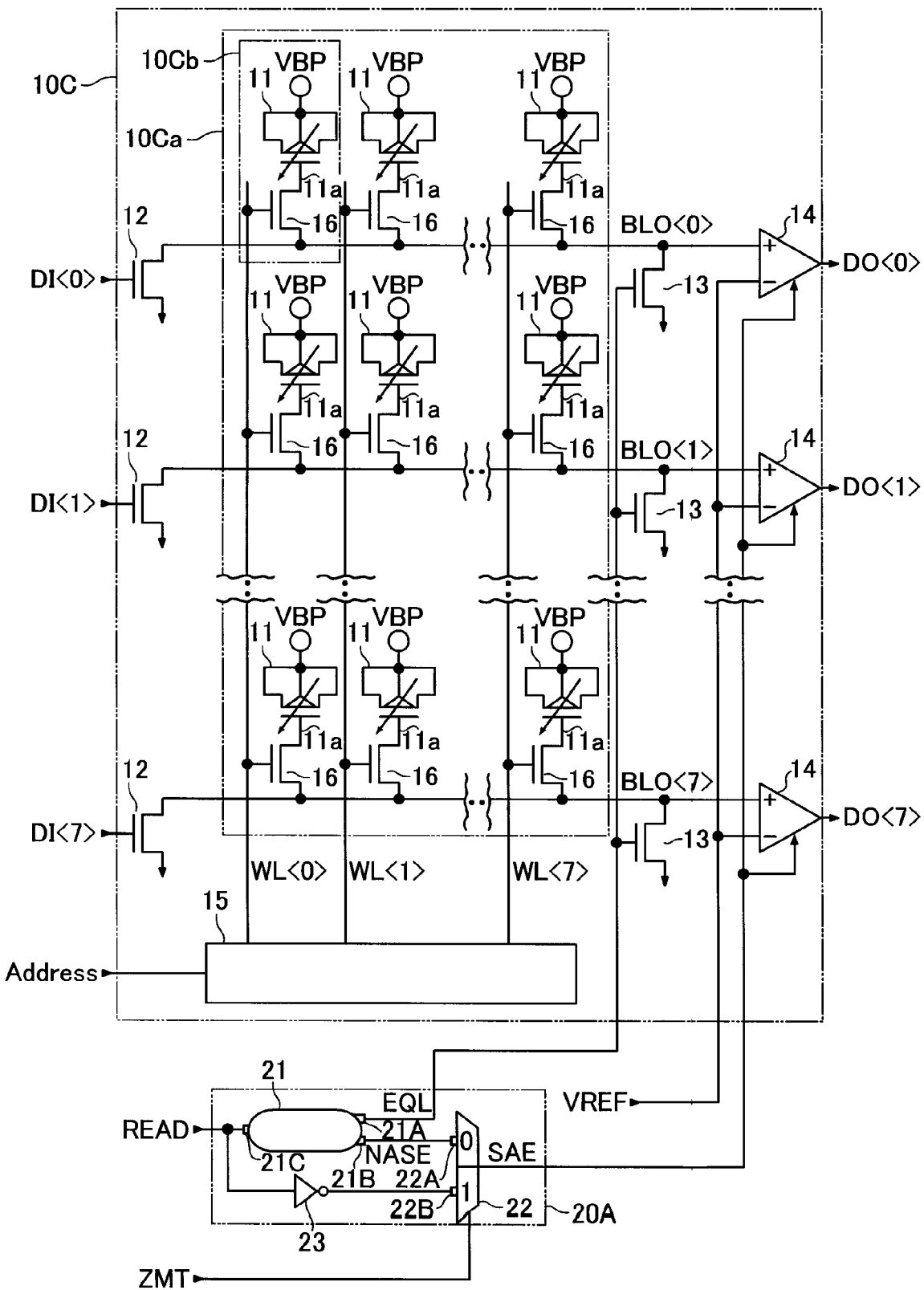
FIG. 5 is a schematic diagram of a non-volatile semiconductor storage device according to a third embodiment of the present invention.

A configuration of a non-volatile semiconductor storage device according to a third embodiment will now be described below with reference to FIG. 5. Besides, the same reference numerals represent the same components as the first and second embodiments and description thereof will be omitted.

The non-volatile semiconductor storage device according to the third embodiment includes a third storage unit 10C and a first operation control unit 20A.

The third storage unit 10C includes a memory cell array 10Ca of memory cells 10Cb, word lines WL<0> to WL<7>, bit lines BL<0> to BL<7>, write transistors 12, sense-node initialization circuits 13, sense amplifiers 14, and a row selection decoder 15.

The memory cell array 10Ca includes the memory cells 10Cb arranged in an 8×8 grid configuration. Each of the memory cells 10Cb includes an anti-fuse element 11 and a selection-gate transistor 16.

Each anti-fuse element 11, which is configured by a p-type MOS transistor, has its source, drain and bulk terminals connected in common to a corresponding programming power supply VBP. A gate terminal (sense node 11a) on the other side of each anti-fuse element 11 is connected to the drain terminal of the respective selection-gate transistor 16.

The source terminal of each of the selection-gate transistors 16 is connected to the respective bit line BL<0> to BL<7> for each arranged column. In addition, the gate terminal of each of the selection-gate transistors 16 is connected to a respective word line WL<0> to WL<7> for each arranged row.

The drain terminal of each of the write transistors 12 is connected to one end of each of the bit lines BL<0> to BL<7>. The source terminal of each of the write transistors 12 is connected to the ground potential. In addition, each input signal DI<0> to DI<7> is input to the gate of each of the write transistor 12.

The drain terminal of each of the sense-node initialization circuits 13 is connected to the respective bit lines BL<0> to BL<7>. The drain terminal of each of the sense-node initialization circuits 13 is connected to the ground potential. In addition, a sense-node-initialization signal EQL is input to the gate of each of the sense-node initialization circuits 13.

The non-inverting input terminal (+) of each of the sense amplifiers 14 is connected to the other end of each of the bit lines BL<0> to BL<7>. A reference potential VREF is input to the inverting input terminal (−) of each of the sense amplifiers 14. In addition, the output terminal of each of the sense amplifiers 14 outputs a respective output signal DO<0> to DO<7>.

The row selection decoder 15 connects one ends of the word lines WL<0> to WL<7>. The row selection decoder 15 selectively activates any one of the word lines WL<0> to WL<7> based on an address signal Address provided from the outside.

Besides, as with the second embodiment, one first operation control unit 20A is provided for each third storage unit 10C. That is, the first operation control unit 20A is shared by eight sets of sense-node initialization circuits 13 and sense amplifiers 14.

Operation of the Third Embodiment

The operation of the non-volatile semiconductor storage device according to the third embodiment is substantially the same as the first embodiment and consequently will not be described in detail here. Wherein, prior to each of the write, read and 0-margin test operations, any one of the word lines WL<0> to WL<7> is activated that is selected by an address signal Address provided from the outside. Then, eight memory cells 10Cb connected to the activated word line are electrically connected to the bit lines BL<0> to BL<7>, while the other memory cells are electrically disconnected from the bit lines BL<0> to BL<7>. That is, the write, read and 0-margin test operations of the third embodiment is the same as those of the first embodiment except the above-mentioned memory cell selection procedure required.

Advantage(s) of the Third Embodiment

Advantages of the non-volatile semiconductor storage device according to the third embodiment will now be described below. The third embodiment may provide similar advantages to those described in the first embodiment. That is, the 0-margin test allows for accurate extraction of anti-fuse elements 11 with poor insulation characteristics. In addition, the extracted anti-fuse elements 11 with poor insulation characteristics may be repaired by means for replacing those with redundant cells, thereby accepting the degradation of 0-data retaining characteristics associated with the thinner gate insulation films. Thus, an inexpensive and highly reliable non-volatile semiconductor storage device may be provided. Besides, one major component, the first operation control unit 20A (including the charging-time control circuit 21, the switch 22, and the inverter 23) may be shared by a plurality of sense-node initialization circuits 13 and sense amplifiers 14 in the non-volatile semiconductor storage device (first storage units 10A), thereby suppressing the increase in area and power consumption due to the implementation.

Fourth Embodiment

Configuration of the Fourth Embodiment

Figure 6:
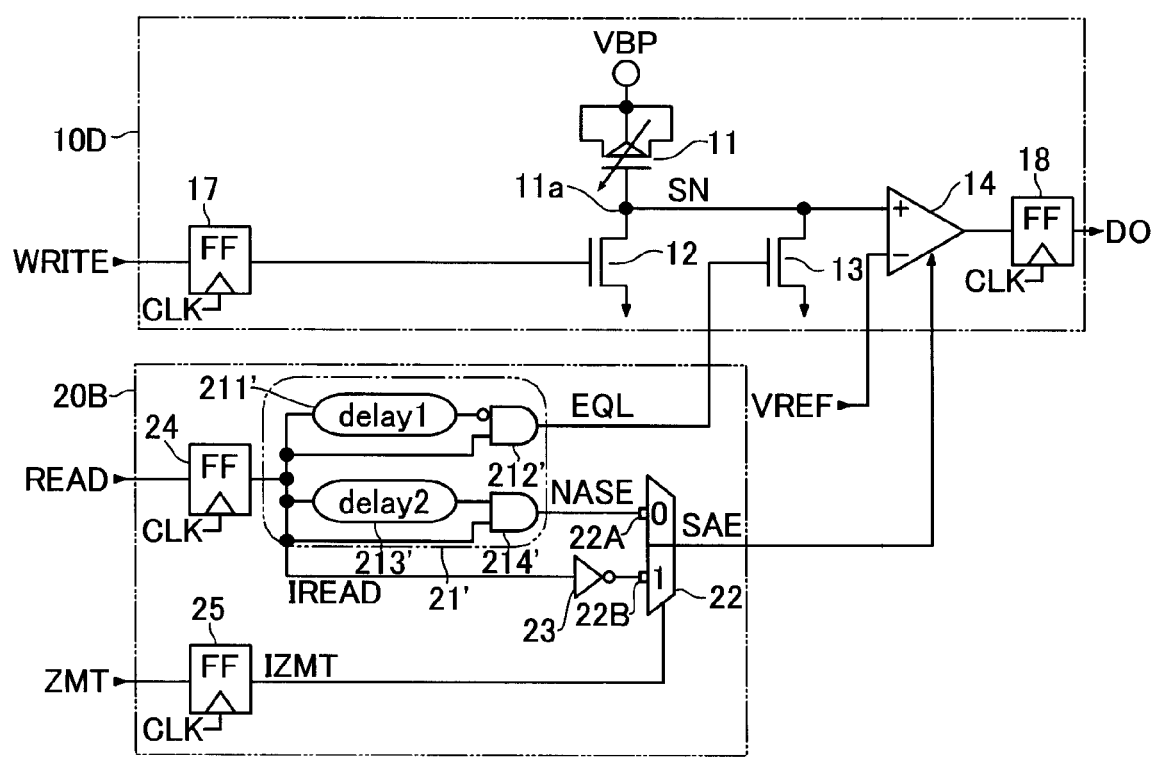
FIG. 6 is a schematic diagram of a non-volatile semiconductor storage device according to a fourth embodiment of the present invention.

A configuration of a non-volatile semiconductor storage device according to a fourth embodiment of the present invention will now be described below with reference to FIG. 6. Besides, the same reference numerals represent the same components as the first to third embodiments and description thereof will be omitted.

The non-volatile semiconductor storage device according to the fourth embodiment includes a fourth storage unit 10D and a second operation control unit 20B.

The fourth storage unit 10D has a first input/output latch 17 and a second input/output latch 18 added to the configuration of the storage unit 10A in the first embodiment. Besides, the first input/output latch 17 and the second input/output latch 18 involve latching signals based on clock signals.

The first input/output latch 17 is provided at the side of the gate of the write transistor 12. The second input/output latch 18 is also provided at the side of the output terminal of the sense amplifier 14.

The second operation control unit 20B has a third input/output latch 24 and a fourth input/output latch 25 added to the configuration of the first operation control unit 20A in the first to third embodiments. In addition, the second operation control unit 20B has a different charging-time control circuit 21' than the first to third embodiments. Besides, the third input/output latch 24 and the fourth input/output latch 25 involve latching signals based on clock signals.

The third input/output latch 24 is provided at the side of the input terminal of the charging time control circuit 21'. The fourth input/output latch 25 is also provided at the side of one terminal of the switch 22 to which the 0-margin-test instruction signal ZMT is input.

The charging-time control circuit 21' includes a first delay circuit 211', a first AND logic gate 212', a second delay circuit 213', and a second AND logic gate 214'.

The first delay circuit 211' receives an input signal from the third input/output latch 24, and upon expiration of a set delay time (at a first timing), outputs an output signal to the inverting input terminal (−) of the first AND logic gate 212'.

The first AND logic gate 212' has the inverting input terminal (−), a non-inverting input terminal (+), and an output terminal. The first AND logic gate 212' receives input signals from the first delay circuit 211' at the inverting input terminal (−) and others from the third input/output latch 24 (internal-operation read signals TREAD) at the non-inverting input terminal (+). The first AND logic gate 212' is activated from a timing of reception of the internal-operation read signal IREAD and generates a sense-node-initialization signal EQL that is inactivated upon expiration of a delay time set by the first delay circuit 211'. Besides, the generated sense-node-initialization signal EQL is output to a sense-node initialization circuit 13.

The second delay circuit 213' receives an input signal from the third input/output latch 24 and outputs an output signal to a non-inverting input terminal (+) of the second AND logic gate 214' upon expiration of a set delay time (at a second timing).

The second AND logic gate 214' has two non-inverting input terminals (+) and one output terminal. The second AND logic gate 214' receives input signals from the second delay circuit 213' and the third input/output latch 24 (internal-operation read signals IREAD) at these two non-inverting input terminals (+), respectively. The second AND logic gate 214' is inactivated from a timing of reception of the internal-operation read signal IREAD and generates a sense-amplifier-activation signal for read operation NASE that is activated upon expiration of a delay time set by the second delay circuit 213'. Besides, the generated sense-amplifier-activation signal for read operation NASE is output to the first input terminal 22A of the switch 22.

The above-mentioned configuration enables the following operations. That is, the switch 22 switches between timing control schemes for the sense-amplifier-activation signal SAE according to the condition (active or inactive) of the 0-margin-test instruction signal ZMT provided from the outside. The 0-margin-test instruction signal ZMT provided from the outside is latched by the fourth input/output latch 25 at a timing of reception of a clock signal CLK and output as an internal 0-margin test instruction signal IZMT. When the internal 0-margin test instruction signal IZMT is in an active state, the sense-amplifier-activation signal SAE is an inverted version of the internal-operation read instruction signal IREAD. Conversely, when the internal 0-margin test instruction signal IZMT is in an inactive state, i.e., during a read operation, the sense-amplifier-activation signal SAE is a sense-amplifier-activation signal for read operation NASE of the charging-time control circuit 21'.

In the above-mentioned configuration, only clock signals are the timing signals that can be input from the outside. Therefore, in the fourth embodiment, the sense-node charging time in 0-margin test operation is controlled by clock cycle time. On the other hand, the sense-node charging time in read operation needs to be constant with respect to the operating frequency (clock cycle) provided from the outside. Therefore, the sense-node charging time in read operation is controlled by the charging-time control circuit 21' incorporated therein.

Read Operation of the Fourth Embodiment

A read operation of the fourth embodiment will now be described below with reference to FIG. 7. Besides, the write operation of the fourth embodiment is the same as those of the first to third embodiments and description thereof will be omitted. Throughout the read operation, each of the write-operation instruction signal WRITE and the 0-margin-test signal ZMT is retained in an inactive state, i.e., at the ground potential 0V. Therefore, the switch 22 outputs a sense-amplifier-activation signal for read operation NASE as a sense-amplifier-activation signal SAE.

Firstly, prior to beginning the read operation, the write power supply VBP and the reference potential VREF are turned on at time t0. Wherein, the potential of the write power supply VBP in the read operation needs to be arranged in such a way that the anti-fuse element 11 may not be broken down and the information that is accumulated in the anti-fuse element 11 may be read as an electrical signal in an accurate manner. For example, when a recent semiconductor device is used, an appropriate potential is 1.2V. In addition, the reference potential VREF is provided to the inverting input terminal of the sense amplifier 14 to determine whether the accumulated information in the anti-fuse element 11 is 0 or 1, comparing with the electrical signal read from the anti-fuse element 11. It is desirable that the reference potential VREF has as low as possible, so that as large a bias voltage as possible may be set that is applied to the anti-fuse element 11 in the read operation. At the same time, the reference potential VREF needs to be set to a high potential such that noise caused in association with the read operation may not affect the potential. Therefore, an appropriate reference potential for VREF is on the order of 0.3V, which is on the order of four times smaller than 1.2V of the power supply voltage.

Figure 7:
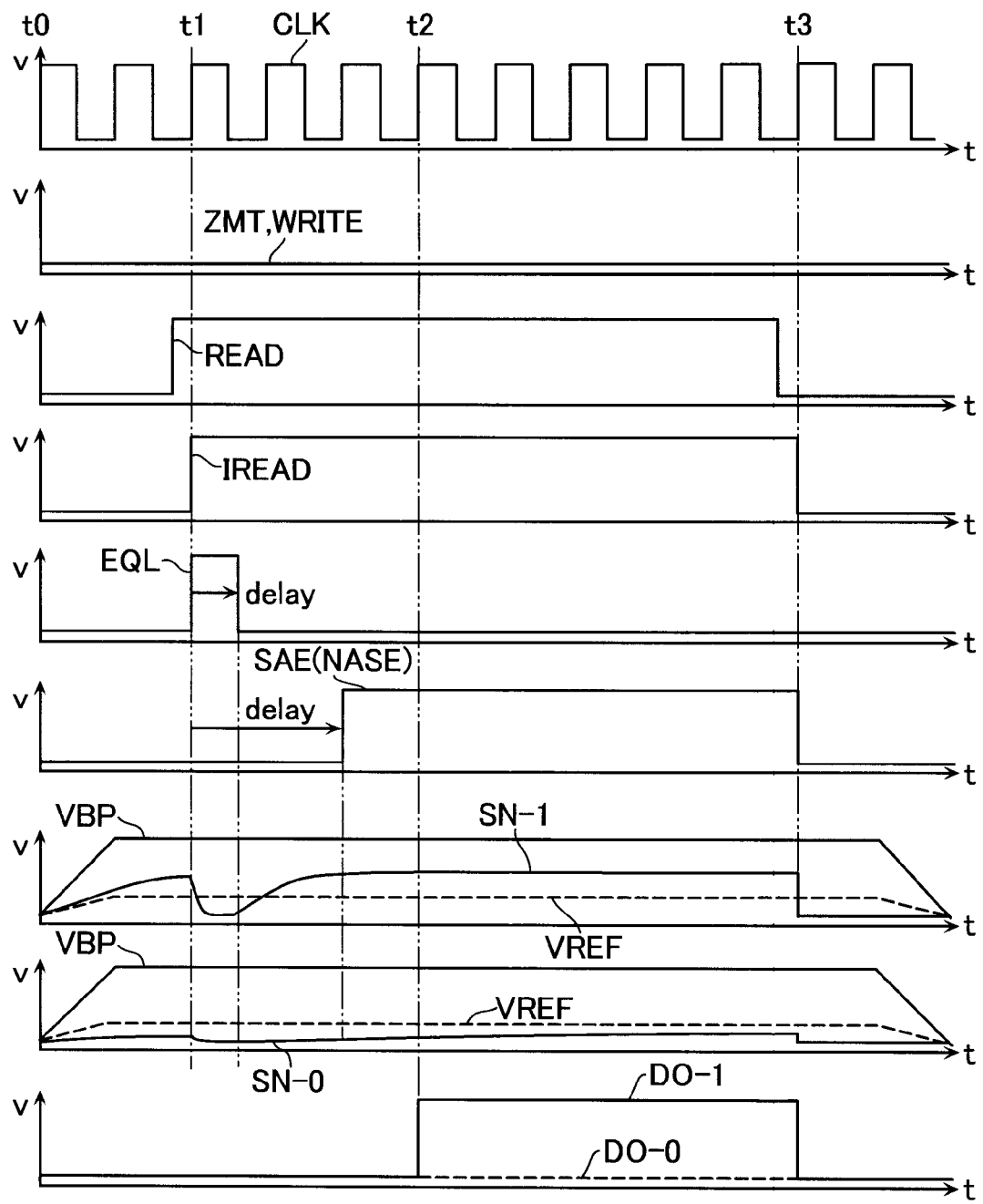
FIG. 7 is a diagram illustrating waveforms during a read operation of the non-volatile semiconductor storage device according to the fourth embodiment of the present invention.

In addition, as illustrated in FIG. 7, a square-wave clock pulse CLK is input to each input/output latch 17, 18, 24 and 25.

Then, after the potential of the write power supply VBP and the reference potential VREF become stable, a read signal READ is input at a point in time prior to time t1. Wherein, the read signal READ is a synchronous signal with respect to the clock signal CLK. Consequently, the read signal READ needs to be activated for input slightly before the timing of the rise of the clock signal CLK.

In response to the read signal READ, at time t1, the internal-operation read signal IREAD is activated. In response, the first delay circuit 211' generates a sense-node-initialization signal EQL. Then, the second delay circuit 213' generates a sense-amplifier-activation signal for read operation NASE. Besides, since the sense-node-initialization signal EQL is the logical AND of the internal-operation read signal IREAD and an inverted version of the internal-operation read signal IREAD with a predetermined time delay, it produces a waveform as illustrated in FIG. 7. In addition, since the sense-amplifier-activation signal for read operation NASE is the logical AND of the internal-operation read signal IREAD and the internal-operation read signal IREAD with a predetermined time delay, it produces a waveform as illustrated in FIG. 7.

Then, in response to these two control signals, data that is stored in the anti-fuse element 11 is read. Besides, the following read operation is the same as that of the first embodiment and description thereof will be omitted.

Wherein, the sense-node-initialization signal EQL and the sense-amplifier-activation signal SAE are generated by an internal delay circuit of the Charging-time control circuit 21'. Therefore, these signals are asynchronous signals with respect to the clock signals CLK. Therefore, the following read operation has a feature that it is not susceptible to external influences including the frequency of the clock signal CLK, etc.

Zero-Margin Test Operation of the Fourth Embodiment

Figure 8:
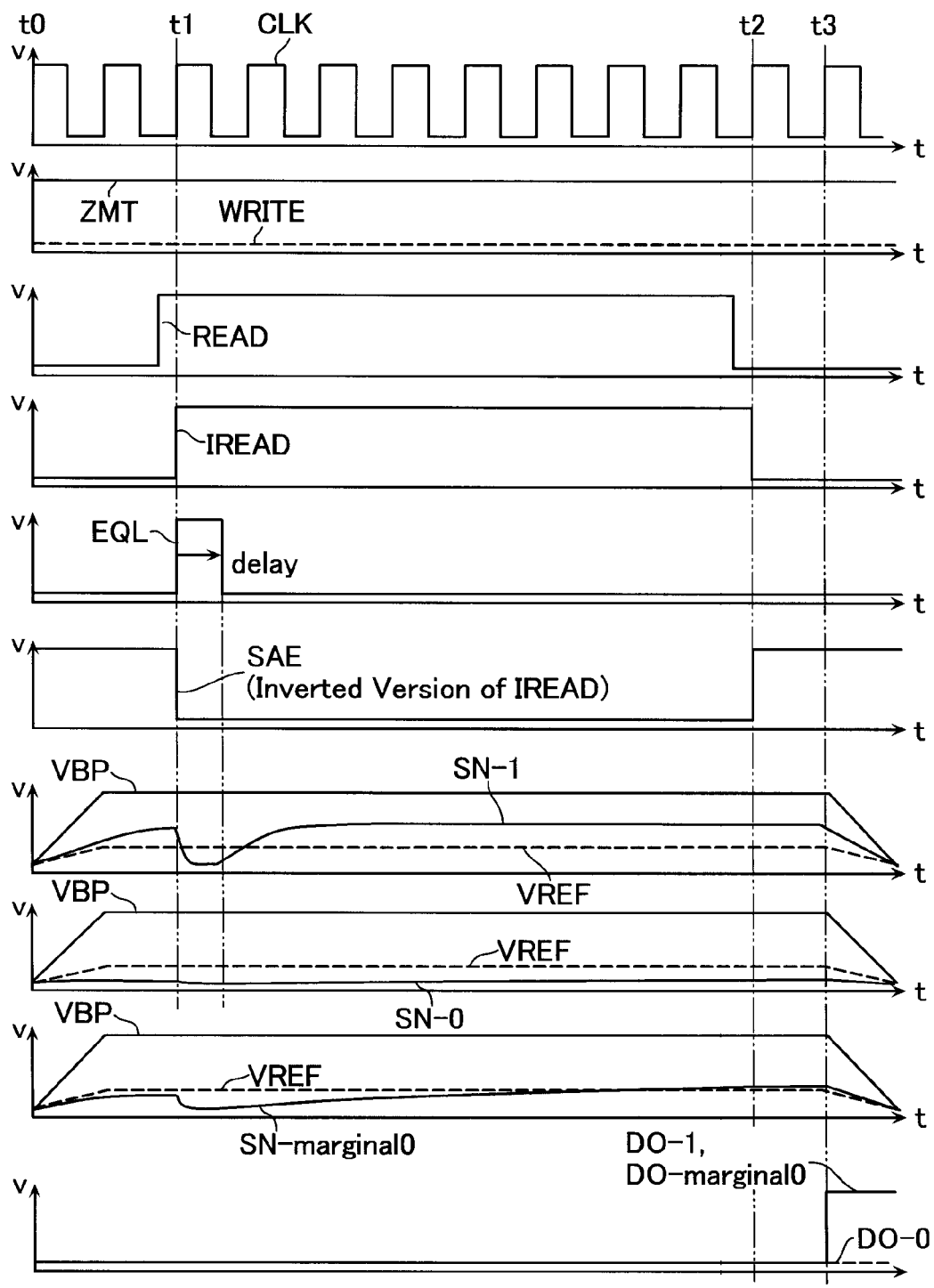
FIG. 8 is a diagram illustrating waveforms during a 0-margin test operation of the non-volatile semiconductor storage device according to the fourth embodiment of the present invention.

A 0-margin test operation of the fourth embodiment will now be described below with reference to FIG. 8. Throughout the read operation, the write-operation instruction signal WRITE is retained in an inactive state, i.e., at the ground potential 0V, while the 0-margin-test signal ZMT is retained in an active state, i.e., at the power supply potential, e.g., 1.2V. Therefore, the switch 22 outputs an inverted version of the internal-operation read signal IREAD as a sense-amplifier-activation signal SAE.

Firstly, prior to beginning the 0-margin test, the write power supply VBP and the reference potential VREF are turned on at time t0. Wherein, the potential of the write power supply VBP in the 0-margin test operation needs to be arranged in such a way that the anti-fuse element 11 may not be broken down and the information that is accumulated in the anti-fuse element 11 may be read as an electrical signal in an accurate manner. For example, when a recent semiconductor device is used, an appropriate potential is on the order of 1.2V. In addition, the reference potential VREF is provided to the inverting input terminal of the sense amplifier 14 to determine whether the accumulated information in the anti-fuse element 11 is 0 or 1, comparing with the electrical signal read from the anti-fuse element 11. It is desirable that the reference potential VREF has as low as possible, so that as large a bias voltage as possible may be set that is applied to the anti-fuse element 11 in the read operation. At the same time, the reference potential VREF needs to be set to a high potential such that noise caused in association with the read operation may not affect the potential. Therefore, an appropriate reference potential for VREF is on the order of 0.3V, which is on the order of four times smaller than 1.2V of the power supply voltage.

Then, after the potential of the write power supply VBP and the reference potential VREF become stable, a read signal READ is input at a point in time prior to time t1. Wherein, the read signal READ is a synchronous signal with respect to the clock signal CLK. Consequently, the read signal READ needs to be activated for input slightly before the timing of the rise of the clock signal CLK. In response to the read signal READ, at time t1, the internal-operation read signal IREAD is activated. In response, the first delay circuit 211' generates a sense-node-initialization signal EQL with a predetermined time delay. On the other hand, the sense-amplifier-activation signal SAE of the 0-margin test operation is generated by the switch 22 using a different scheme than that of the read operation. That is, the sense-amplifier-activation signal SAE is an inverted version of the internal-operation read signal IREAD as illustrated in FIG. 8. In response to these two control signals, a 0-margin test is performed for testing insulation characteristics of the anti-fuse element 11 as the following procedures:

A sense node initialization period is the period between when the sense-node-initialization signal EQL is activated immediately after the previous activation of the internal-operation read signal IREAD and when it returns to its inactive state again. The sense node initialization period is defined by the first delay circuit 211' within the charging-time control circuit 21'.

In response to the sense-node-initialization signal EQL, the sense-node initialization circuit 13 begins its operation and the potential of the sense node 11a is initialized to the ground potential. In FIG. 8, a sense node signal SN-1 indicates the behavior of the potential in the sense node 11a when the gate insulation film of the anti-fuse element 11 is broken down, i.e., when 1 data is stored in the anti-fuse element 11. In addition, a sense node signal SN-0 indicates the behavior of the potential in the sense node 11a when the gate insulation film of the anti-fuse element 11 is not broken down, i.e., when 0 data is stored in the anti-fuse element 11. Further, a sense node signal SN-marginal0 indicates the behavior of the potential in the sense node 11a when the gate insulation film of the anti-fuse element 11 has poor insulation characteristics despite 0 data stored therein.

A sense-node charging time is the period between when the sense-node-initialization signal EQL returns to its inactive state again and time t2 when the sense-amplifier-activation signal SAE is activated. However, unlike the normal read operation, the sense-node charging time here is defined by the pulse width of the internal-operation read signal IREAD generated by the read signal READ that is provided from the outside.

During this sense-node charging period, the sense node 11a, which is previously initialized to the ground potential, is charged by a read current that flows through the anti-fuse element 11, and the potential of the sense node 11a increases accordingly. The increasing rate of potential depends on the magnitude of the read current that flows through the anti-fuse element 11.

If the gate insulation film of the anti-fuse element 11 is broken down, i.e., if 1 data is stored in the anti-fuse element 11, then a larger amount of current flows through the anti-fuse element 11. Consequently, as indicated by the sense node signal SN-1, a rapid increase in potential of the sense node 11a is observed. On the other hand, if the gate insulation film of the anti-fuse element 11 is not broken down, i.e., if 0 data is stored in the anti-fuse element 11, then a smaller amount of current flows through the anti-fuse element 11. Consequently, as indicated by the sense node signal SN-0, the potential of the sense node 11a is substantially retained at the ground potential 0V.

Further, if the gate insulation film has poor insulation characteristics despite 0 data is expected to be stored therein, then the potential of the sense node 11a increases at a very slow rate as indicated by the sense node signal SN-marginal0.

Thereafter, at time t2 when the sense-amplifier-activation signal SAE transitions to an active state, the sense amplifier 14 begins its operation. At this moment, the sense amplifier 14 detects the difference in potential between the potential of the sense node 11a connected to a non-inverting input terminal (+) and the reference potential VREF connected to the inverting input terminal (−), the result of which is output as an output signal DO. If 1 data is stored in the anti-fuse element 11, then a sense node signal DO-1 becomes the power supply potential, e.g., 1.2V.

On the other hand, if 0 data is stored in the anti-fuse element 11, a sense node signal DO-0 becomes the ground potential 0V. Further, if the anti-fuse element 11 has poor insulation characteristics despite 0 data stored therein, a sense node signal DO-marginal0 becomes the power supply potential, e.g., 1.2V. Thereafter, during the sense-amplifier-activation signal SAE is in an active state, the state of the output signal of the sense amplifier 14 remains unchanged.

Advantage(s) of the Fourth Embodiment

Advantages of the non-volatile semiconductor storage device according to the fourth embodiment, will now be described below. Firstly in the read operation, a current threshold for read operation is mainly set by the sense-node charging time that is used to determine whether the stored data in the anti-fuse element 11 is 0 or 1. Wherein, the sense-node charging time is an internal parameter that is set by a circuit constant in the non-volatile semiconductor storage devices Therefore, although it is difficult to set the absolute value of the current threshold for read operation accurately, that absolute value remains constant regardless of the timing of external input signals. That is, the current threshold for read operation may be constant regardless of the usage of the non-volatile semiconductor storage device.

On the other hand, although a current threshold for 0-margin test is also mainly set by the sense-node charging time, the sense-node charging time is controlled by an external input signal, i.e., the read signal READ. In other words, the pulse width of an inverted version of the read signals READ (internal-operation read signals IREAD) may be controlled based on clock signals CLK. Therefore, the current threshold for 0-margin test is a measurement parameter that can be easily changed by the clock signal CLK from the outside. This enables free and accurate setting of values for the current threshold for 0-margin test. For example, if the current detection is performed with a minute leakage, e.g., several nA leakage, it is required to set such a long sense-node charging time that can last over several ms. A delay circuit that generates such a long delay time that can last over several ms has a large layout size, which could lead to increased costs for its implementation. In addition, the resulting delay time offers a low degree of precision since it is susceptible to noise caused by the operating environment temperature, power supply voltage, external noise, or the like. Therefore, the method for controlling the sense-node charging time using external input signals is more effective than others using internal delay circuits.

This 0-margin test allows for accurate extraction of anti-fuse elements with poor insulation characteristics. Then, the extracted anti-fuse elements with poor insulation characteristics may be repaired by means for replacing those with redundant cells, thereby accepting the degradation of 0-data retaining characteristics associated with the thinner gate insulation films. Thus, an inexpensive and highly reliable non-volatile semiconductor storage device may be provided.

Additionally, in a recent design approach of integrated circuits, it is necessary to insert an input/output latch to the input/output signal terminal of a functional circuit block and provide integrated circuits of clock-synchronous type for simplifying the design. As in the configuration of the fourth embodiment, timing rules for input/output signals are required only for the setup and hold time with respect to the clock signals, thereby simplifying the timing design.

Fifth Embodiment

Configuration of the Fifth Embodiment

Figure 9:
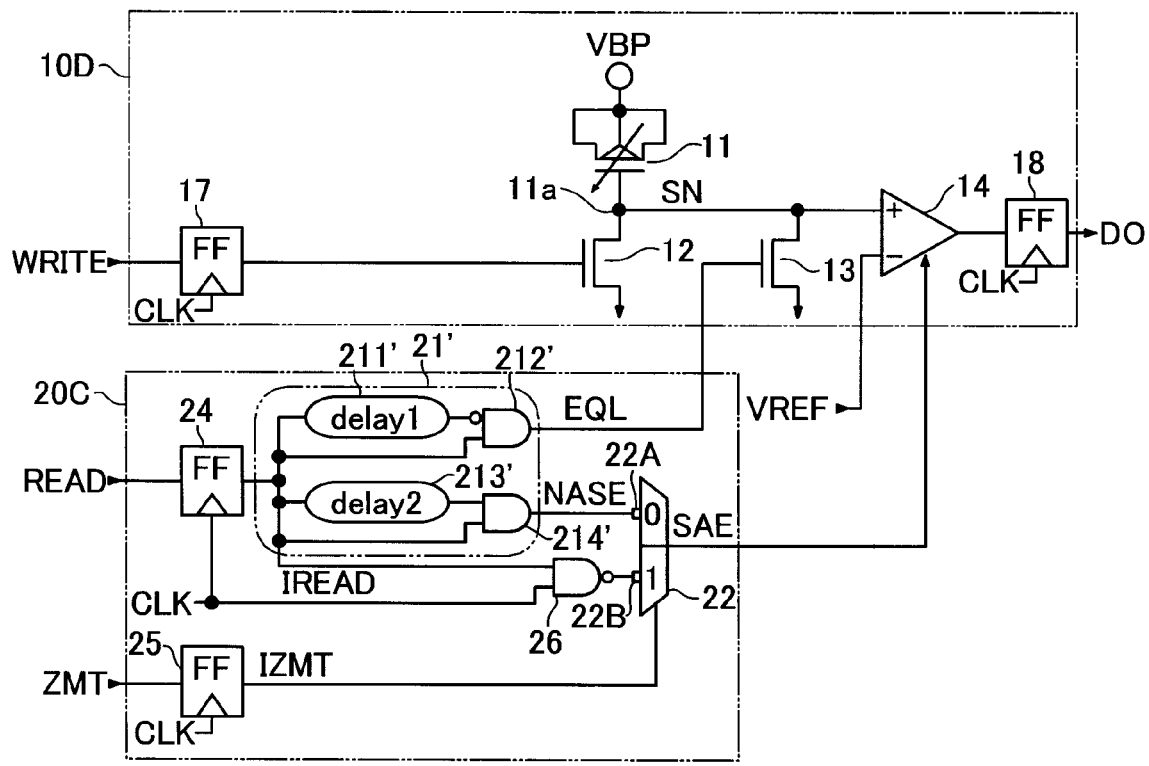
FIG. 9 is a schematic diagram of a non-volatile semiconductor storage device according to a fifth embodiment of the present invention.

A configuration of a non-volatile semiconductor storage device according to a fifth embodiment of the present invention will now be described below with reference to FIG. 9. Besides, the same reference numerals represent the same components as the first to fourth embodiments and description thereof will be omitted.

The non-volatile semiconductor storage device according to the fifth embodiment includes a fourth storage unit 10D and a third operation control unit 20C. That is, the non-volatile semiconductor storage device according to the fifth embodiment is different than that of the fourth embodiment in the configuration of the third operation control unit 20C. The non-volatile semiconductor storage device according to the fifth embodiment is appropriate when the pulse width of clock signals CLK Way be freely controlled.

The third operation control unit 20C replaces the inverter 23, in the configuration of the third operation control unit 20C according to the third embodiment, with a NAND circuit 26. The NAND circuit 26 receives inputs from the charging-time control circuit 21', i.e., internal-operation read signals IREAD, and others input to the third input/output latch 24, i.e., the clock signals CLK. In addition, the NAND circuit 26 outputs the output signals to the switch 22.

Zero-Margin Test Operation of the Fifth Embodiment

A 0-margin test operation of the non-volatile semiconductor storage device according to the fifth embodiment will now be described below with reference to FIG. 10. Besides, the write operation of the fifth embodiment is the same as that of the first embodiment and description thereof will be omitted. Similarly, the read operation of the fifth embodiment is the same as that of the fourth embodiment and description thereof will be omitted.

Figure 10:
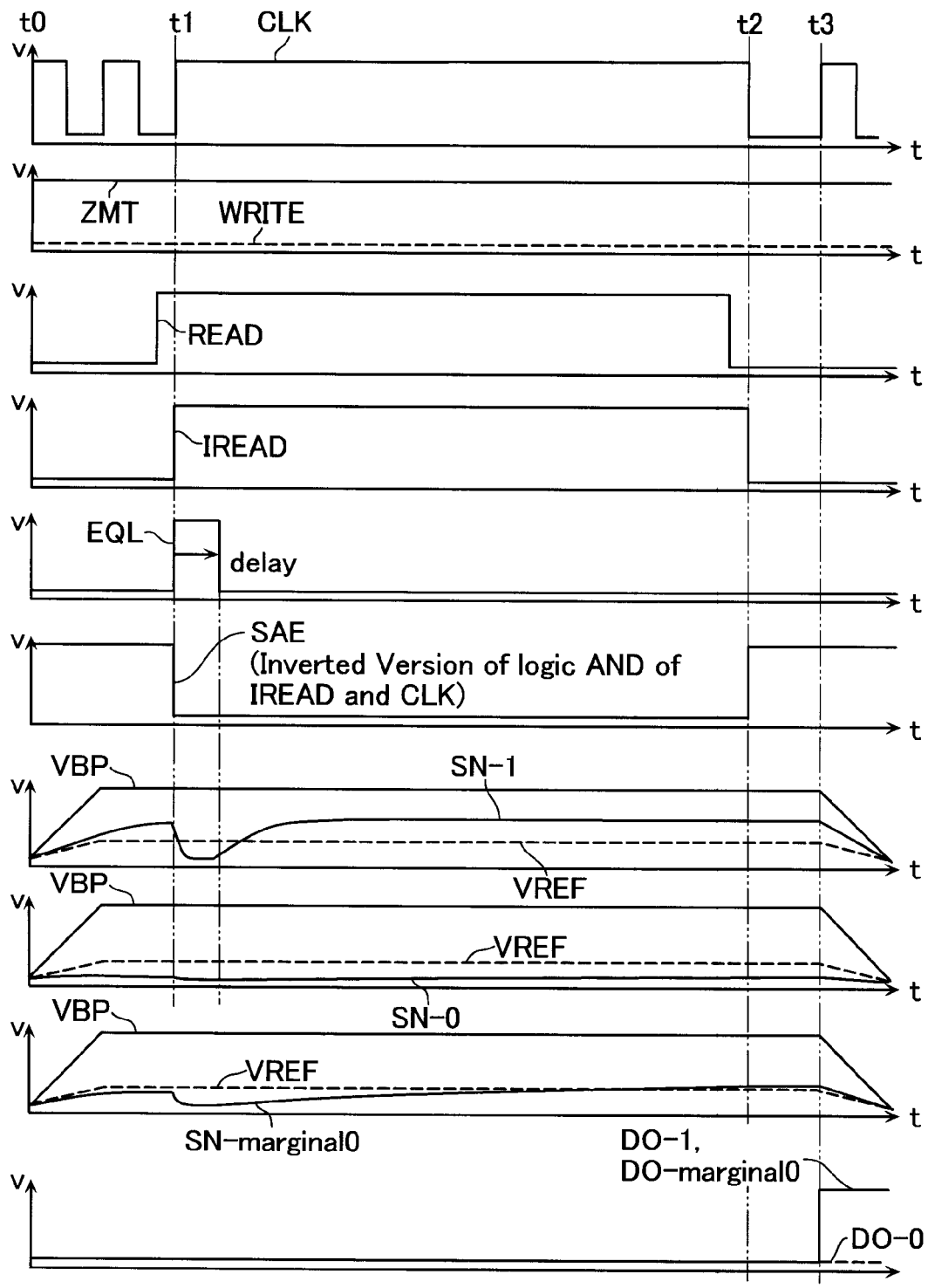
FIG. 10 is a diagram illustrating waveforms during a 0-margin test operation of the non-volatile semiconductor storage device according to the fifth embodiment of the present invention.

FIG. 10 is an operational waveform diagram for illustrating the 0-margin test operation of the fifth embodiment. Throughout the 0-margin test operation, the write-operation instruction signal WRITE is retained in an inactive state, i.e., at the ground potential 0V, while the 0-margin-test signal ZMT is retained in an active state, i.e., at the power supply potential, e.g., 1.2V. Therefore, the switch 22 outputs an inverted signal of the logical AND of the internal-operation read signal IREAD and the clock signal as a sense-amplifier-activation signal SAE.

Firstly, prior to beginning the 0-margin test operation, the write power supply VBP and the reference potential VREF are turned on at time t0. Then, after the potential of the write power supply VBP and the reference potential VREF become stable, a read signal READ is issued at a point in time prior to time t1. With these manipulations, a 0-margin test operation is started and a sense-node initialization operation is performed by the first delay circuit 211' of the charging-time control circuit 21'. The above-mentioned operation is the same as that of the fourth embodiment and consequently will not be described in detail hereafter.

Then, at time t2, the sense-amplifier-activation signal SAE causes the sense amplifier 14 to begin its operation. The sense-amplifier-activation signal SAE of the 0-margin test operation is switched by the switch 22 to a different form than in the read operation. That is, the sense-amplifier-activation signal SAE of the 0-margin test operation becomes an output signal of the NAND circuit 26 based on each input of the internal-operation read signal IREAD and the clock signal CLK. The rest of operations, e.g., the operation of the sense amplifier 14 controlled by the sense-amplifier-activation signal SAE and the behavior of the potential in the sense node 11a, are the same as those of the fourth embodiments, and consequently will not be described in detail hereafter.

Advantage(s) of the Fifth Embodiment

Advantages of the non-volatile semiconductor storage device according to the fifth embodiment will now be described below. In the fifth embodiment, the sense-node charging time during the 0-margin test operation may be controlled using the pulse width of clock signals CLK from the outside in a free and accurate manner. In other words, the pulse width of the clock signals CLK may be used to control the pulse width of the sense-amplifier-activation signal SAE. It is assumed that the 0-margin test function provided herein is used in a chip discrimination test after the manufacturing of semiconductor chips and before the packaging process. In this case, each signal provided from the outside including a clock signal is provided by a tester for checking operation of integrated circuits. As such, the pulse width of clock signals may be manipulated in a relatively simple manner. Rather, when such a long timing is controlled that can last over several ms, it is more efficient and accurate to use a timer implemented in the tester. Thus, the present embodiment that manipulates the pulse width of the clock signals is more preferable than the first to fourth embodiments.

Other Embodiments

In addition to the above-mentioned first to fifth embodiments, many additional embodiments of are possible for controlling the sense-node charging time in 0-margin test operation with external signals. However, any configuration may be used in those embodiments that falls within the spirit and scope of the present invention. Such configurations that fall within the spirit and scope of the present invention involve: controlling the sense-node charging time in read operation with internal timing signals from a delay circuit; controlling the sense-node charging time in 0-margin test operation with external signals; and selecting among control schemes by a switch. Therefore, any configuration with the configuration that falls within the spirit and scope of the present invention may provide the same effects as the above-mentioned embodiments.

What is claimed is:

1. A non-volatile semiconductor storage device comprising:
   one or more memory cells including anti-fuse elements capable of writing data by breaking down a gate insulation film of a MOS transistor with a high voltage;
   a sense node having its one end connected to each of the anti-fuse elements;
   a sense amplifier comparing a potential of the sense node with a reference potential and amplifying the difference therebetween, the sense amplifier being activated according to a sense-amplifier activation signal;
   an initialization circuit initializing the potential of the sense node according to an initialization signal;
   a control circuit outputting the initialization signal at a predetermined timing after input of an external signal input from the outside and outputting a first activation signal to activate the sense amplifier at a predetermined timing after input of the external signal; and
   a switching circuit outputting the first activation signal as the sense-amplifier activation signal when a normal data read operation is performed, and outputting an inverted version of the external signal as the sense-amplifier activation signal when a test execution is instructed for the one or more memory cells before the gate insulation film is broken down.

2. The non-volatile semiconductor storage device according to claim 1, wherein
   the plurality of memory cells are arranged in parallel.

3. The non-volatile semiconductor storage device according to claim 1, wherein
   the plurality of memory cells are arranged in a grid configuration.

4. The non-volatile semiconductor storage device according to claim 1, wherein the control circuit comprising:
   a first delay circuit outputting a first delayed signal, the first delayed signal corresponding to the external signal delayed at a first timing;
   a first AND circuit generating the initialization signal based on an inverted version of the first delayed signal and the external signal;
   a second delay circuit generating a second delayed signal, the second delayed signal corresponding to the external signal delayed at a second timing; and
   a second AND circuit generating the first activation signal based on the second delayed signal and the external signal.

5. The non-volatile semiconductor storage device according to claim 1 comprising an input/output latch circuit for latching a signal based on a clock signal, wherein
   the switching circuit controls a pulse width of the inverted version of the external signal based on the clock signal.

6. The non-volatile semiconductor storage device according to claim 1 comprising a write transistor having its one end connected to the sense node and the other end connected to ground, wherein
   the initialization circuit has its one end connected to the sense node and the other end connected to ground.

7. The non-volatile semiconductor storage device according to claim 6, wherein
   the write transistor and the initialization circuit are brought into off states in advance, a write voltage is boosted that is applied to one end of each of the anti-fuse elements when a data write operation is performed, and then the write transistor is brought into an on state.

8. The non-volatile semiconductor storage device according to claim 1, wherein
   when a data read operation is performed, and when a test execution is instructed for the one or more memory cells before the gate insulation film is broken down, a read voltage is applied to one end of each of the anti-fuse elements, and then the sense node is initialized at the initialization circuit.

9. The non-volatile semiconductor storage device according to claim 2, wherein the control circuit comprising:
   a first delay circuit outputting a first delayed signal, the first delayed signal corresponding to the external signal delayed at a first timing;
   a first AND circuit generating the initialization signal based on an inverted version of the first delayed signal and the external signal;
   a second delay circuit generating a second delayed signal, the second delayed signal corresponding to the external signal delayed at a second timing; and
   a second AND circuit generating the first activation signal based on the second delayed signal and the external signal.

10. The non-volatile semiconductor storage device according to claim 2 comprising an input/output latch circuit for latching a signal based on a clock signal, wherein
    the switching circuit controls a pulse width of the inverted version of the external signal based on the clock signal.

11. The non-volatile semiconductor storage device according to claim 2 comprising a write transistor having its one end connected to the sense node and the other end connected to ground, wherein
    the initialization circuit has its one end connected to the sense node and the other end connected to ground.

12. The non-volatile semiconductor storage device according to claim 11, wherein
    the write transistor and the initialization circuit are brought into off states in advance, a write voltage is boosted that is applied to one end of each of the anti-fuse elements when a data write operation is performed, and then the write transistor is brought into an on state.

13. The non-volatile semiconductor storage device according to claim 2, wherein
    when a data read operation is performed, and when a test execution is instructed for the one or more memory cells before the gate insulation film is broken down, a read voltage is applied to one end of each of the anti-fuse elements, and then the sense node is initialized at the initialization circuit.

14. The non-volatile semiconductor storage device according to claim 3, wherein the control circuit comprising:
    a first delay circuit outputting a first delayed signal, the first delayed signal corresponding to the external signal delayed at a first timing;
    a first AND circuit generating the initialization signal based on an inverted version of the first delayed signal and the external signal;
    a second delay circuit generating a second delayed signal, the second delayed signal corresponding to the external signal delayed at a second timing; and
    a second AND circuit generating the first activation signal based on the second delayed signal and the external signal.

15. The non-volatile semiconductor storage device according to claim 3 comprising an input/output latch circuit for latching a signal based on a clock signal, wherein the switching circuit controls a pulse width of the inverted version of the external signal based on the clock signal.

16. The non-volatile semiconductor storage device according to claim 3 comprising:
- a plurality of word lines;
- a row selection decoder, connected to one end of each of the plurality of word lines, selectively activating any one of the plurality of word lines;
- a plurality of bit lines connected to one ends of the sense amplifier and the initialization circuit; and
- a selection gate transistor having its gate terminal connected to each of the plurality of word lines, its drain terminal connected to the sense node, and its source terminal connected to each of the bit lines.

17. The non-volatile semiconductor storage device according to claim 16 comprising a write transistor having its one end connected to each of the bit lines and the other end connected to ground, wherein the initialization circuit has its one end connected to the sense node and the other end connected to ground.

18. The non-volatile semiconductor storage device according to claim 17, wherein
the write transistor and the initialization circuit are brought into off states in advance, a write voltage is boosted that is applied to one end of each of the anti-fuse elements when a data write operation is performed, and then the write transistor is brought into an on state.

19. The non-volatile semiconductor storage device according to claim 3, wherein
when a data read operation is performed, and when a test execution is instructed for the one or more memory cells before the gate insulation film is broken down, a read voltage is applied to one end of each of the anti-fuse elements, and then the sense node is initialized at the initialization circuit.

\* \* \* \* \*